United States Patent [19]
Pfaff

[11] Patent Number: 4,808,119
[45] Date of Patent: Feb. 28, 1989

[54] ZERO INSERTION FORCE MOUNTING HOUSINGS FOR ELECTRONIC DEVICE PACKAGES

[76] Inventor: Wayne K. Pfaff, 309 Steeplechase, Irving, Tex. 75062

[21] Appl. No.: 148,070

[22] Filed: Jan. 25, 1988

Related U.S. Application Data

[63] Continuation of Ser. No. 912,837, Sep. 29, 1986, abandoned, which is a continuation-in-part of Ser. No. 771,104, Aug. 30, 1984, Pat. No. 4,618,199.

[51] Int. Cl.⁴ .................................... H01R 13/635
[52] U.S. Cl. ............................................ 439/268
[58] Field of Search ............ 379/17 CF, 74 R, 75 M, 379/75 MP; 439/68-73, 264, 330-331, 266-270, 525, 526

[56] References Cited

U.S. PATENT DOCUMENTS

| | | | |
|---|---|---|---|
| 3,732,529 | 5/1973 | Weisenburger | 339/17 CF |
| 4,420,207 | 12/1983 | Nishikawa | 339/75 M |
| 4,422,703 | 12/1983 | Christensen et al. | 339/74 R |
| 4,496,205 | 1/1985 | Christensen et al. | 339/75 M |
| 4,618,199 | 10/1986 | Pfaff | 339/74 R |
| 4,623,208 | 11/1986 | Kerul et al. | 339/17 CF |

FOREIGN PATENT DOCUMENTS 2119173 11/1983 United Kingdom ........... 339/17 CF

*Primary Examiner*—Joseph H. McGlynn
*Attorney, Agent, or Firm*—Kanz, Scherback & Timmons

[57] ABSTRACT

Disclosed are mounting housings for use on burn-in boards, circuit boards and the like. The housings include an insulating base support containing a plurality of electrically conductive axially elongated pins extending therethrough. A spreader mounted for reciprocal movement with respect to the pins and normal to the first major face of the base support has a plurality of spreader members adjacent the pins so that movement of the spreader deflects the pins longitudinally to permit insertion of the leads projecting from the device package between the pins and permitting the pins to contact only the edges of the leads.

5 Claims, 5 Drawing Sheets

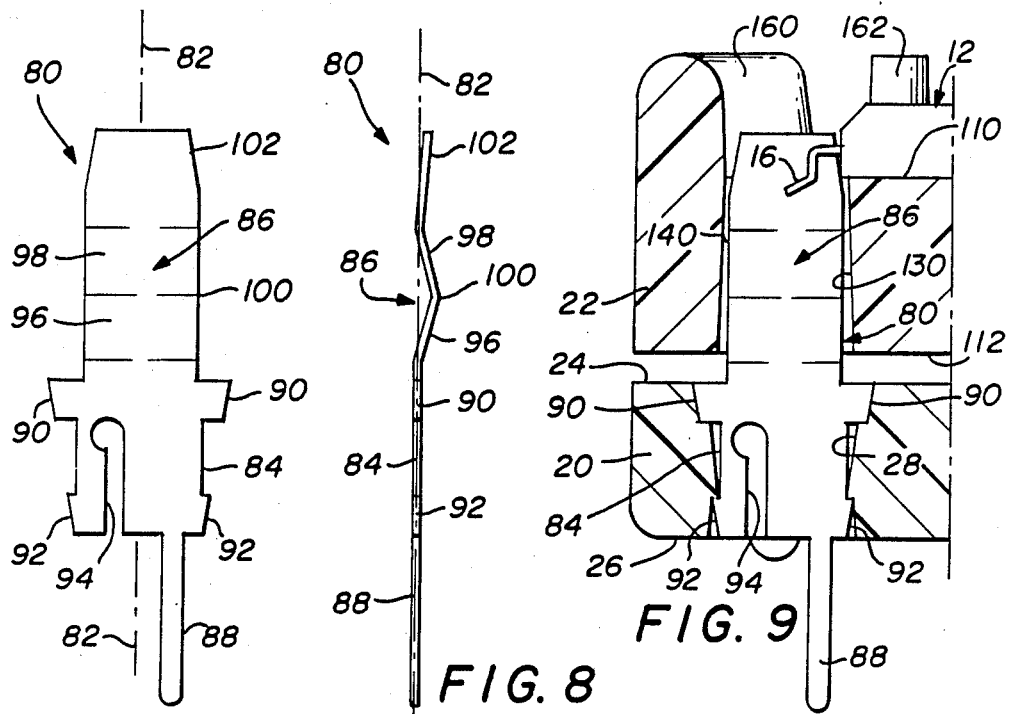
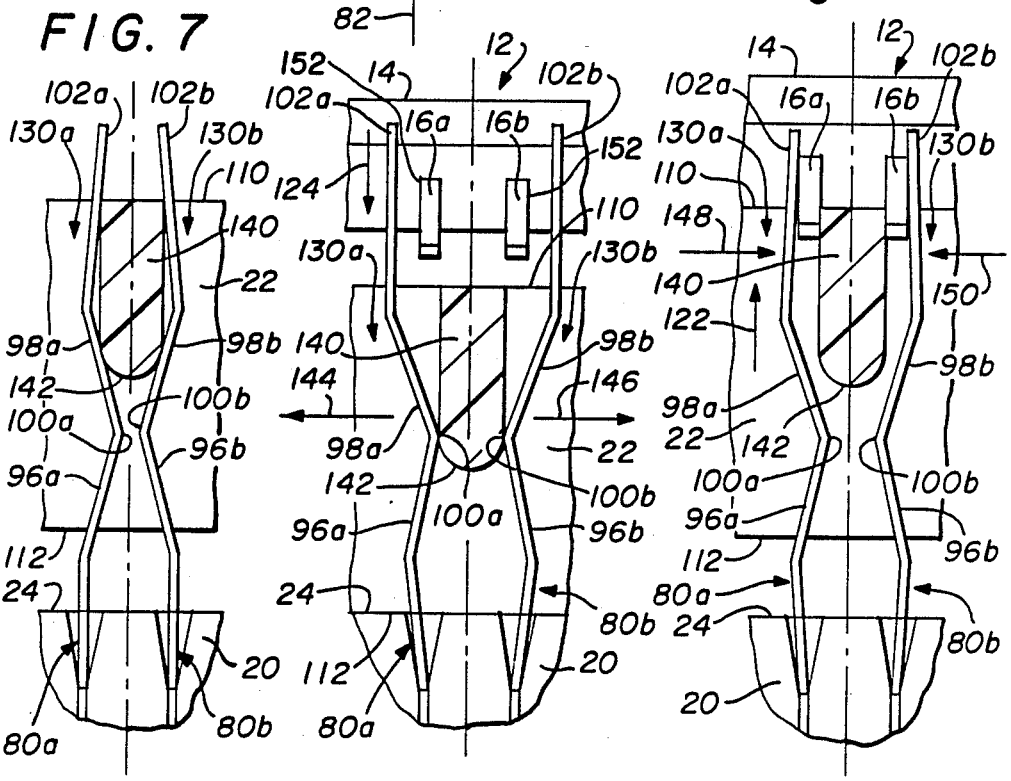

ZERO INSERTION FORCE MOUNTING HOUSINGS FOR ELECTRONIC DEVICE PACKAGES

This application is a continuation of application Ser. No. 06/912,837 filed Sept. 29, 1986 (now abandoned) which is a continuation-in-part of application Ser. No. 771,104 filed Aug. 30, 1984, now U.S. Pat. No. 4,618,199 issued Oct. 21, 1986.

This invention relates generally to electronic test equipment. More particularly, it relates to mounting housings for receiving electronic device packages and interconnecting the leads extending from the packages with a test board or other printed circuit board or the like.

In the semiconductor electronics industry, various semiconductor components are packaged in standard electronic device packages. One such standard package is the small outline integrated circuit package (commonly referred to as an SOIC or SO package) which essentially comprises an enclosed rectangular housing containing the semiconductor component with parallel rows of leads extending from opposite edges of the package. The leads are substantially flat ribbons of electrically conductive material electrically connected within the housing to the semiconductor device. The leads extend downwardly from the rectangular housing and then laterally outwardly on each side of the housing in a common plane. The SOIC package thus permits the semiconductor component to be surface mounted by soldering the leads to preformed pads on the surface of a printed circuit board or the like. In another standard package, leads as described above with respect to the SOIC package extend from all four edges of the housing. This package is commonly referred to as a quad package and is likewise intended for surface mounting.

In another standard package known as the dual-in-line (DIP) package, the leads extend outwardly and downwardly from opposite sides of the housing and are adapted to be inserted into holes in a circuit board or the like.

Many devices, whether packaged in DIP, SOIC or quad packages, must be subjected to various tests after the device has been fully assembled and packaged. Testing usually includes mounting the devices in sockets in a burn-in board which is then mounted in a burn-in oven where the devices are subjected to various physical, thermal and electronic functional stresses. The devices which satisfactorily complete such tests are then approved for use.

Various burn-in board sockets have be designed for use with DIP packages. Conventional burn-in mounting housings typically include a body defining a plurality of holes for receipt of the leads of the package. Each of the holes includes a conductive pin resiliently biased in a direction perpendicular to the edge of the housing for contact with the flat side of the leads extending from the housing. As the leads are inserted into or withdrawn from the holes, sliding frictional contact with the conductive contact pins creates resistance to movement of the electronic device package. However, such conventional mounting housings exhibit several undesirable characteristics. The force required to insert and remove the leads from a conventional mounting housing imposes undesirable stresses on the component and the package. The force applied by the conductive pins on the flat side of the leads required to ensure an effective electrical connection between the leads and the pins also tends to deform and damage the leads since the strength of the leads is weakest in that direction. If the housing is not correctly aligned with the mounting housing, the leads may be damaged or bent while being inserted into a conventional mounting housing. Even if aligned correctly, the leads may become worn through repeated insertion and removal.

In accordance with the present invention, a zero insertion force mounting means is provided which includes a base support having a plurality of axially elongated conductive pins mounted therein in parallel rows. A spreader is provided operable independently of the base support to deflect the pins away from contact with the leads of the package as the package is mounted on or withdrawn from the mounting means so that contact resistance is eliminated. When the electronic device package is mounted on the mounting means, the pins contact only the side edges of the leads of the package. Means may be provided to align and guide the electronic device package with respect to the mounting means to ensure effective contact between the contact pins and the leads.

In its basic form, the mounting housing of the invention comprises a plurality of elongated contact pins arranged substantially parallel in a row extending along a first axis, each of the contact pins having a first end, a second end and a camming surface offset from the central axis thereof. A base support member is provided with first and second oppositely disposed major faces supporting the contact pins with the second end of each pin extending from the second major face of the base member and the first end of each contact pin and the camming surface extending from the first major face. A receptacle for the package is provided having first and second oppositely disposed major faces positioned substantially parallel with the base support member and reciprocally mounted for movement between a first position spaced from the base support member and a second position substantially adjacent the base support member. A row of apertures is provided extending through the receptacle, each of which receives the first end of one of the contact pins. Spreaders formed integral with the receptacle are aligned to contact a camming surface on each pin when the receptacle is moved from the first position to the second position to deflect the first end of each of the contact pins in a direction parallel with the axis of the row of pins and form an opening for receiving a lead from the device package between the first end of the pin and a side wall of the aperture.

The conductive pins of the mounting housing of the invention contact only side edges of the leads. Thus all force exerted on the leads is in a direction which is parallel with the longitudinal edge of the housing and applied to the leads in the plane in which they exhibit their greatest strength. Thus the leads cannot be bent, deformed or damaged in any way by insertion into or removal from the mounting housing of the invention. In the preferred embodiment, each spreader for bending the pins contacts two pins simultaneously spreading them in opposite directions so that the surface area of the mounting means can be sufficiently small to accommodate device packages with closely spaced leads.

Other features and advantages of the invention will become more readily understood from the following detailed description taken in connection with the appended claims and attached drawings in which:

FIG. 7 is a front view of a pin of FIG. 1;

FIG. 8 is a side view of the pin of FIG. 7;

FIG. 9 is a magnified cross-sectional view of one of the pins of FIG. 7 mounted in the mounting housing;

FIG. 10A is a side view of a pin of FIG. 7 with the mounting housing empty and the mounting housing cap in an upper position;

FIG. 10B is a side view of the pin of FIG. 7 with an electronic device package being inserted into the mounting housing and the mounting housing cap in a compressed position; and FIG. 10C is a side view of a pin of FIG. 7 with an electronic device package inserted into the mounting housing.

It is to be noted that the appended drawings illustrate only a preferred embodiment of the invention and are therefore not to be considered limiting of its scope, for the invention may admit to other equally effective embodiments.

Figure 1:
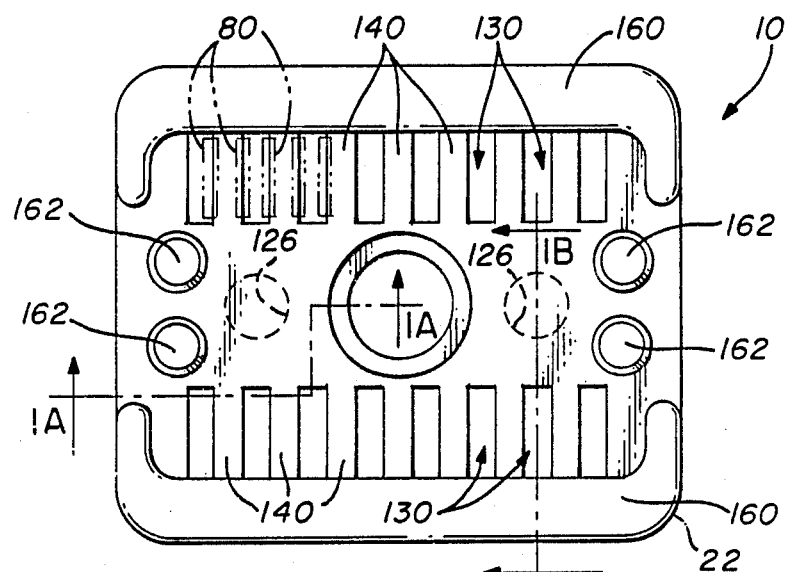
FIG. 1 is a top plan view of a twenty-eight pin version of the preferred embodiment of the invention.
Figure 1A:
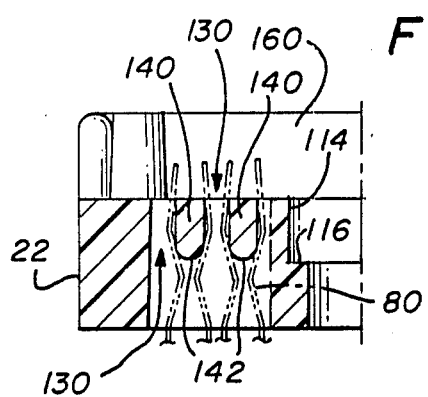
FIG. 1A is a partial sectional view of the mounting housing of FIG. 1 taken through section lines 1A—1A.
Figure 1B:
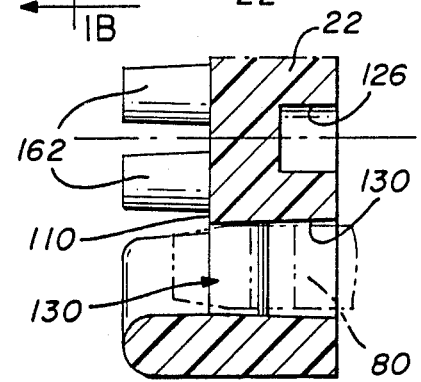
FIG. 1B is a partial sectional view of the mounting housing of FIG. 1 taken through section lines 1B—1B.
Figure 2:
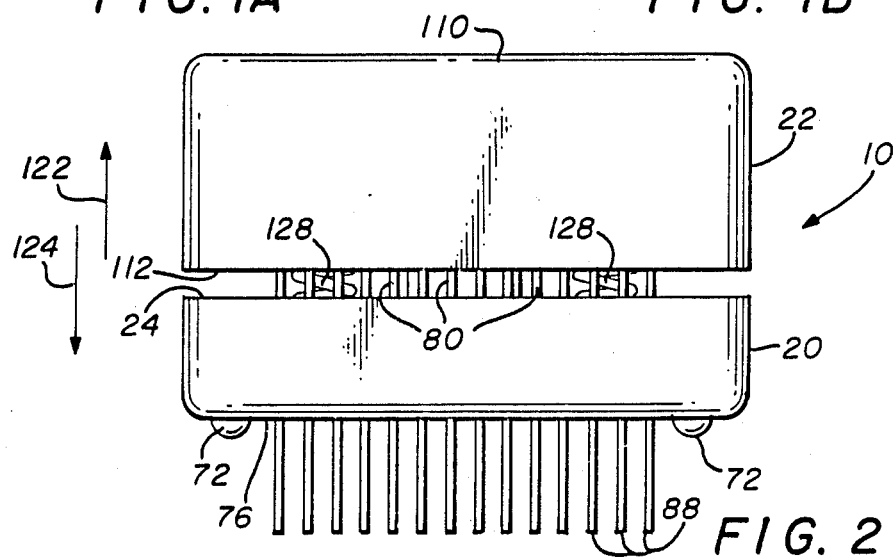
FIG. 2 is a side view of the mounting housing of FIG. 1.
Figure 3:
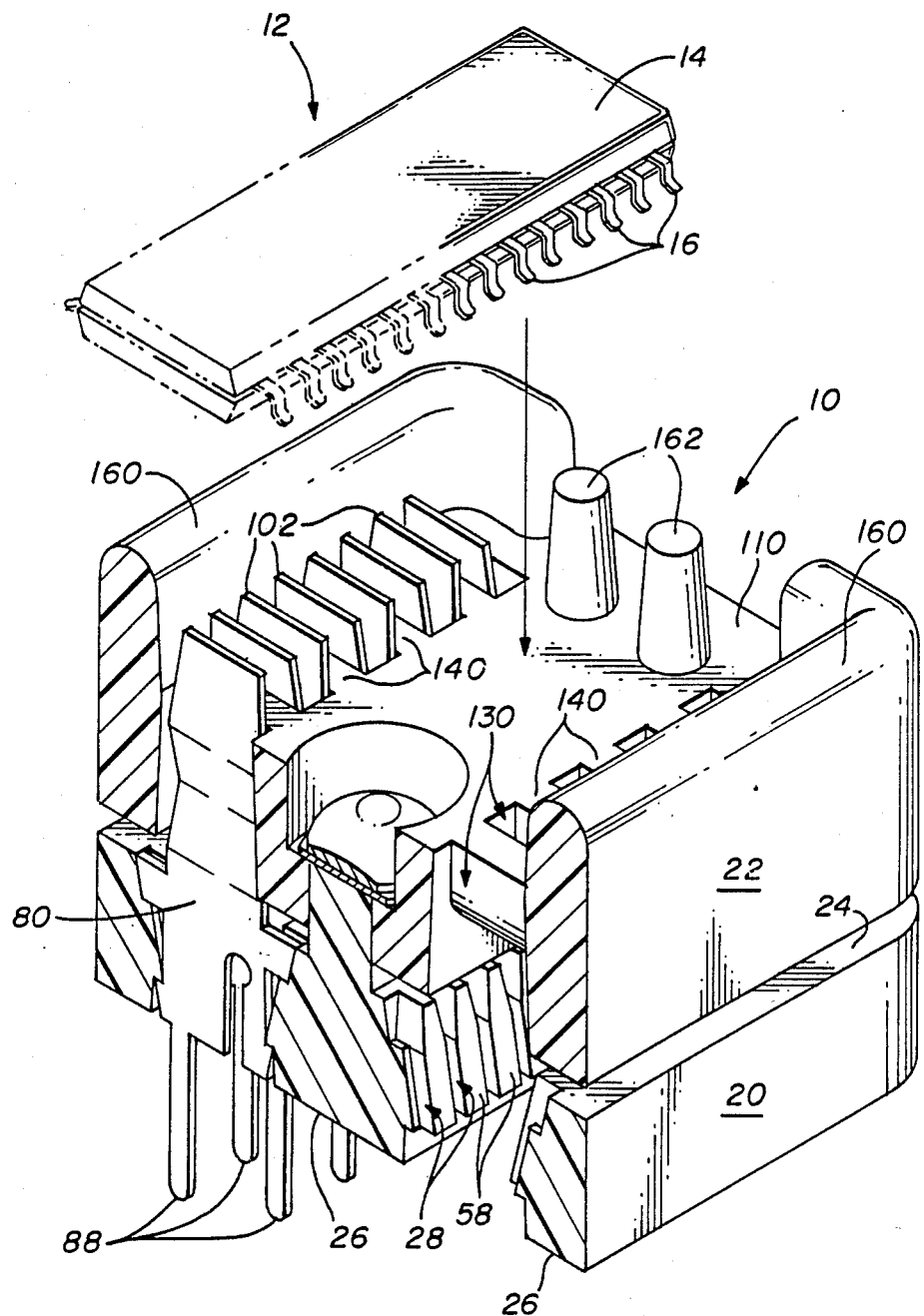
FIG. 3 is a cross-sectional isometric view of the mounting housing of FIG. 1.
Figure 4:
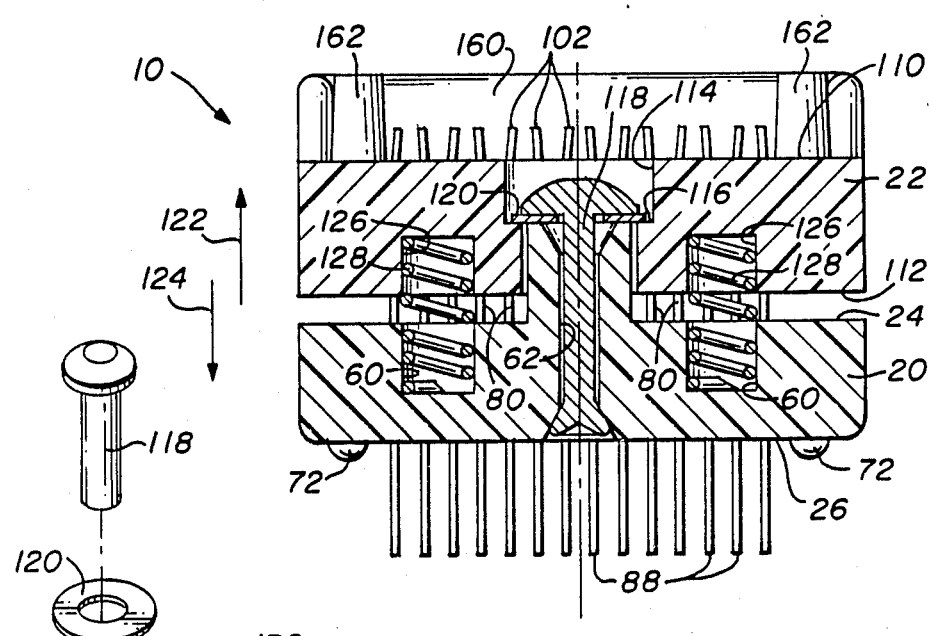
FIG. 4 is a longitudinal cross-sectional view of the mounting housing of FIG. 1.
Figure 5:
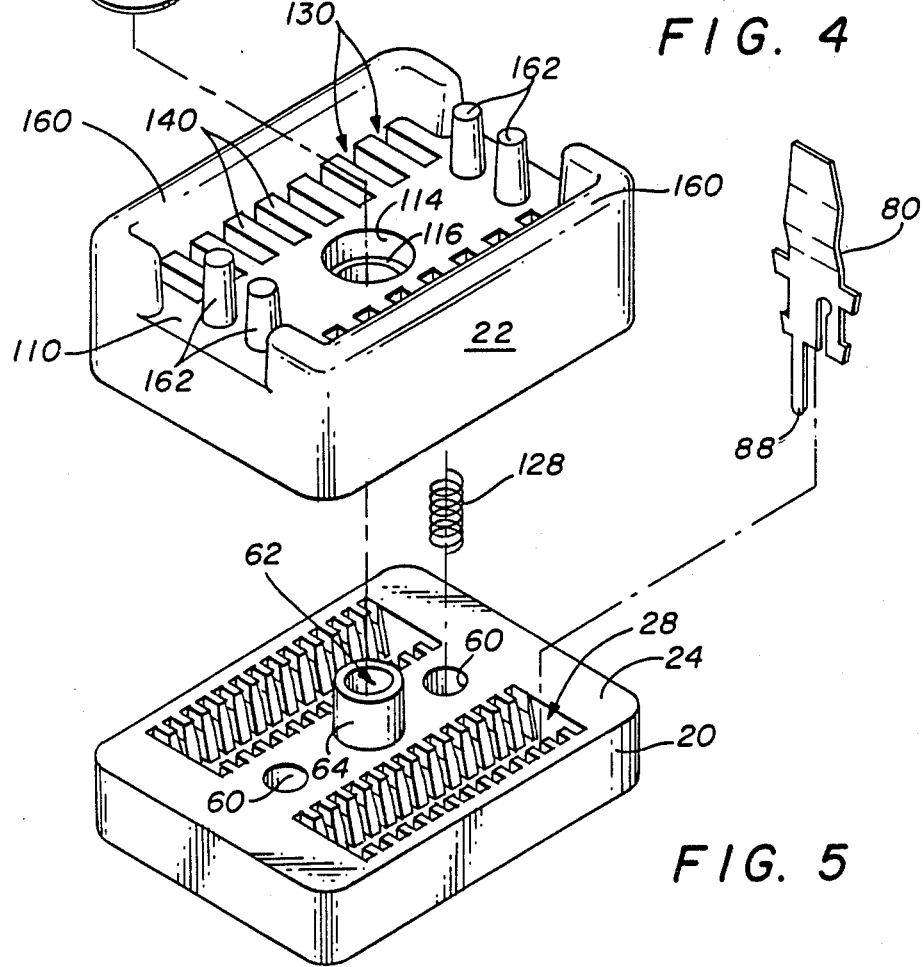
FIG. 5 is an exploded view of a portion of the mounting housing of this, invention.

Referring now to FIGS. 1-3, shown therein is a mounting housing 10 according to the present invention. The zero insertion force mounting housing 10 is for receipt of and electrical interconnection with an electronic device package 12 as shown in FIG. 3. The electronic device package 12, in the preferred embodiment of the invention, is an SOIC package. The package 12 includes rectangular housing 14 having a plurality of leads 16 projecting from either longitudinal side edge thereof in a pair of parallel rows. The leads 16 are generally S-shaped, projecting generally downwardly from the housing and then laterally outwardly in a common plane. In the illustrated embodiment, the SOIC package includes twenty-eight leads in two parallel rows of fourteen leads each projecting from either longitudinal side edge of the housing.

Figure 6:
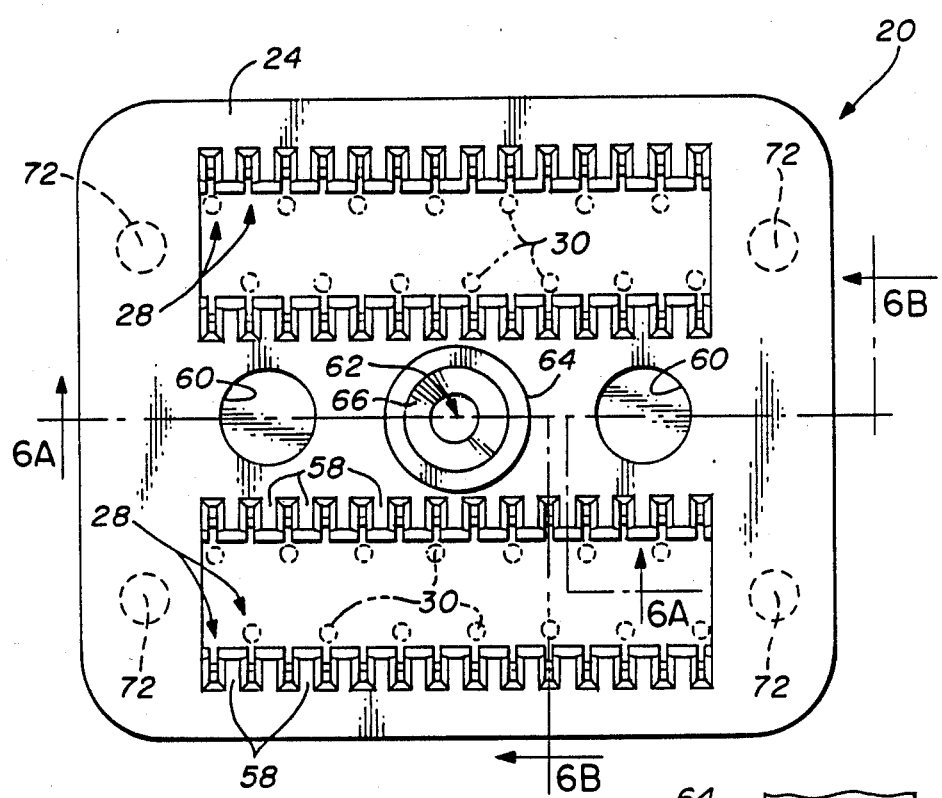
FIG. 6 is a top plan view of the mounting housing base of FIG. 1.

Mounting housing 10 includes a base 20 and cap 22. Base 20 is shown in more detail in FIGS. 6, 6A and 6B and is constructed of electrically insulating material, such as ryton, which is readily molded into a desired shape. The base defines first and a second major faces 24 and 26, respectively, longitudinal axis 27 and a plurality of recesses 28. The recesses 28 are formed in two parallel longitudinally aligned rows of fourteen recesses each and laterally spaced parallel with the longitudinal axis 27. The recesses in each of the rows communicate with each other and extend through the base between the first and second major faces of the base.

Figure 6B:
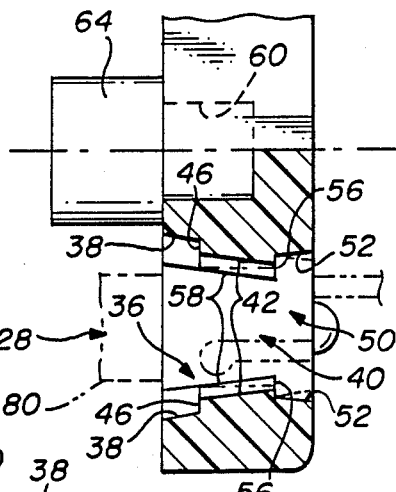
FIG. 6B is a partial sectional view of the mounting housing of FIG. 6 taken through section lines 6B—6B.
Figure 6A:
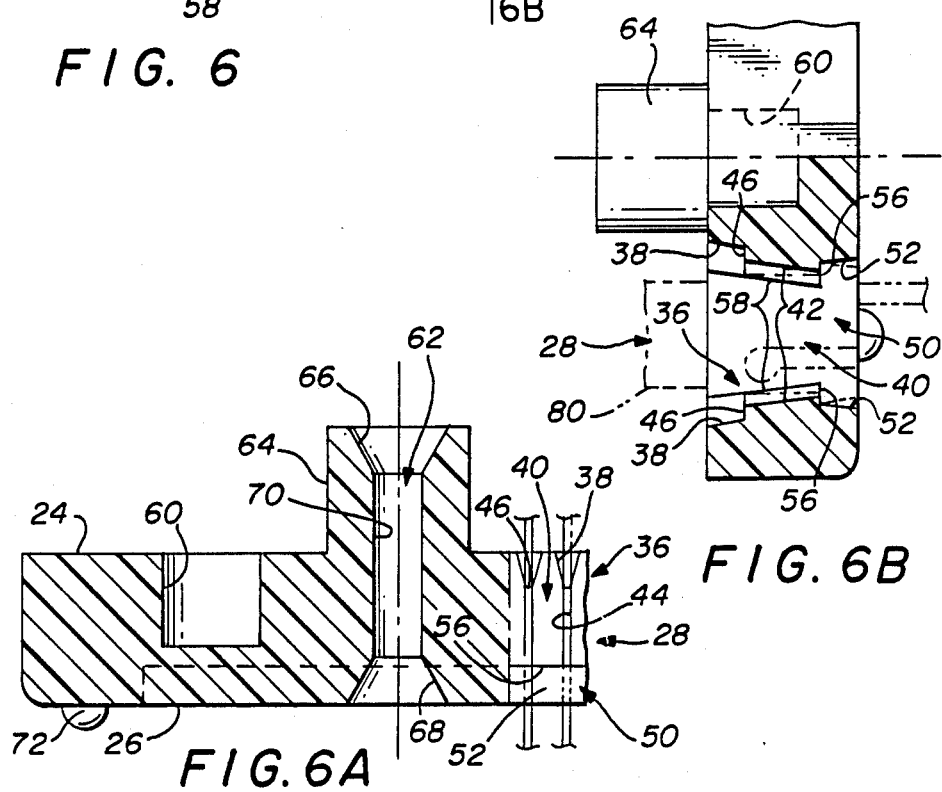
FIG. 6A, is a partial sectional view of the mounting housing of FIG. 6 taken through section lines 6A—6A.

As is shown more particularly in FIGS. 6A and 6B, each recess 28 includes an upper section 36 having inwardly and downwardly tapering sides 38. Middle section 40 also includes inwardly and downwardly tapering lateral sides 42 and defines opposing shoulders 46 at the junction with the first section. Lower section 50 defines upwardly and inwardly tapering lateral side edges 52 and opposing shoulders 56 at the juncture with middle section 40. Opposing downwardly and inwardly tapering walls 58 partially separate adjacent recesses 28 from each other along the length of each of the rows.

Base 20 also includes a pair of longitudinally spaced cavities 60 and passageway 62 formed between the rows of recesses. Passageway 62 extends through the base between the first and the second major faces 24 and 26 thereof and through annular flange 64 projecting from the first major surface. The passageway 62 includes funnel-shaped openings 66 and 68 at either end communicating with cylindrical intermediate section 70. A plurality of spaced protuberances 72 project from the second major surface 26 of the base and assist in spacing the mounting housing from the surface of a printed circuit board (not shown) or the like.

FIGS. 7 and 8 illustrate a contact pin 80 for use in the mounting housing 10. Pin 80 is constructed of resilient electrically conductive material such as stainless steel with a suitable electrically conductive coating such as a beryllium copper alloy or the like. The pin defines axis 82 and includes a lower base portion 84 and an upper "gull wing" portion 86. The base portion includes a shank 88 projecting from one edge thereof parallel with, but laterally offset from, the axis 82 of the pin. The base portion also includes two spaced pairs of laterally projecting flanges 90 and 92, respectively, about axis 82 of the pin. Slot 94 is formed in the pin parallel with, but laterally offset from, axis 82 on an opposite side from the shank 88. The gull wing portion 86 of the pin 80 consists of joined sections 96 and 98 inclined in opposite directions from the plane defined by the base portion 84. The inclined sections 96 and 98 form a projecting knee 100 or camming surface at their juncture. Lip 102 extends from section 98 and is likewise inclined with respect to the plane defined by the base portion 84.

The width of the base portion 84 and the relative positions of the flanges 90 and 92 enable a contact pin to be inserted into and secured within one of the recesses 28 in the base of the mounting housing. More specifically, and as is depicted in FIG. 9, the flanges 90 contact the opposing shoulders 46 in the upper section 36 of the recess. Flanges 92 contact opposing shoulders 56 in the lower section 50 of the recess to prevent the pin from longitudinal movement with respect to the recess. Walls 58 between the recesses retain the pins against lateral movement. Slot 94 in the pin enables the pin to be deformed or deflected as the base portion of the pin is inserted into one of the recesses.

Returning to FIG. 3, a plurality of contact pins 80 is mounted in the base 20 with adjacent pins in each row of recesses in the base mounted in opposite orientations. That is, the knees 100 of adjacent pins 80 are directed in opposite longitudinal directions with respect to the base. This ensures that the mounting shanks 88 of each adjacent pin are offset so that the shanks form a staggered pattern (shown at locations 30 in FIG. 6) along the length of the base. With the base portions of the pins installed in the base of the mounting housing, the shanks of the pins project from the second major face of the base exteriorly of the mounting housing. The shanks may be inserted into and soldered within a like pattern of twenty-eight holes (not shown) in a printed circuit board (not shown) or the like for mounting the mounting housing on the printed circuit board and electrical connection through the pins exteriorly of the mounting housing. The upper section 86 of each pin forms a free end extending from the first major face 24 of the base, generally normal to the first and second major faces of the base and transverse to longitudinal axis 27 when in an undeflected or relaxed state.

Cap 22 is constructed of similar material as the base 20 and has outer lateral dimensions substantially equal to the outer lateral dimensions of the base 20. The cap 22 defines first major face 110 and second major face 112. The cap is operatively connected to base 20 and includes a passageway 114 aligned with and receiving the exterior of annular flange 64 of the base in sliding relationship so as to be also aligned with and concentric about passageway 62 in the base. Annular shoulder 116 is defined in the passageway 114. Rivet 118 is secured within the passageways 114 and 62 with washer 120 against annular shoulder 116. The cap and base are capable of reciprocal movement in directions 122 and 124 with respect to each other, limited in direction 122 by the length of the rivet and in direction 124 by contact between face 24 of the base and face 112 of the cap. The cap 22 also includes a pair of spaced cavities 126, each aligned with one of the cavities 60 in the base. A pair of springs 128 is located between the base and the cap, each with opposite ends in one of cavities 60 and 126 in the base and cap so as to urge the base and the cap away from each other and in direction 122. The cap is thus shiftable between an upper position (shown in FIGS. 2, 3, 4 and 9) as urged by the springs 128 and lower position, in which the housing is compressed, with the second major face 112 of the cap in contact with the first major face 24 of the base.

The cap also includes a pair of laterally spaced longitudinal rows of seven or more openings 130 each which are transverse to the longitudinal axis 27 of the base and vertically aligned with one of the recesses 28 in the base so that the free ends 86 of the pins 80 extend from the base through one of the openings 130 above first major surface 110 of the cap when in the relaxed state. The opposed inner edges of the free ends of the pins in the spaced parallel rows, along with the first major face 110 of the cap, cooperate to define a channel for receipt of the electronic device package housing in a plane parallel with the first major face 110 of the cap. To this end, the channel conforms closely in lateral dimensions to the dimensions of the electronic device package housing.

Camming spreader means are provided within the cap to spread or deflect the free ends of the pins from their position generally normal to the first major face of the base. As illustrated in FIGS 1–3, the spreader means comprises a plurality of transverse parallel spreader members 140 extending laterally at regular intervals between the openings 130 in both rows of openings in the cap. The spreader members 140 each present a downwardly facing camming surface 142 and each is formed in the cap so as to be juxtaposed between a pair of adjacent pins extending through the openings with the knee 100 of each adjacent pin directed toward the spreader member as shown schematically in FIG. 10A. When the cap 22 is in its upper position as urged by the springs 128, the face 24 of the base an the face 112 of the cap are separated. Adjacent pins 80a and 80b extend upwardly through adjacent openings 130a and 130b in the cap in a relaxed state with spreader member 140 interposed between pins 80a and 80b and the camming surface 142 near respective upper inclined sections 96a and 96b.

When the mounting housing is compressed by forcing cap 22 downwardly in direction 124 against the force of springs 128 until the cap contacts the base (as shown in FIG. 10B) the surface 142 of the spreader member 140 is forced into simultaneous contact with the opposing knees 100a and 100b of the pins, thereby spreading or deflecting the pins apart from each other in opposite directions 144 and 146 parallel with the longitudinal axis 27 of the base. In this position, housing 14 of electronic device package 12 having leads 16 may be lowered without resistance onto the first major surface 110 of the cap into the channel between the rows of pins. With the electronic device package positioned in the mounting housing, the leads 16 extend downwardly from either side of the housing 14 into the aligned openings 130 in the cap. More specifically, the openings 130 and spreader members 140 are constructed and positioned so that a lead (16a and 16b in FIG. 10B) falls closely on either side of each spreader member into the gap in openings 130a and 130b between the spreader member and the deflected pins 80a and 80b.

Once the electronic device package 12 is positioned in the mounting housing, the cap 22 may be released and is automatically urged by the springs 128 in direction 122 so as to return to its upper position. In this position (as shown in FIG. 10C) the spreader member 140 is carried upwardly out of contact with the knees of the adjacent pins. Consequently, pins 80a and 80b spring back in opposite directions 148 toward their relaxed position normal to the first major face of the base until the leads 16a and 16b are encountered. The pins thus each apply a resilient force to and are in contact with the side edges 152 of the leads. This not only ensures effective electrical continuity through the pin and the lead, but mechanically secures the electronic device package in the mounting housing. Since the pins are pressing on the side edges of the leads, the force applied to the leads is in the direction of maximum strength for the leads and damage to the leads is minimized. It should be noted that in this embodiment, each spreader coacts with opposing knees 100 on an adjacent pair of contact pins to spread the free ends of the contact pins in opposite directions. Thus when the pins are allowed to return to the relaxed state, they contact and apply lateral pressure in opposite directions on opposite outer edges of two adjacent leads. In this manner the forces applied longitudinally on half of the leads in one direction is substantially counterbalanced by the forces applied longitudinally on the other half of the leads in the opposite direction. It will be observed, of course, that all the knees 100 could be aligned in the same direction in each row and an individual spreader member used for each contact pin. Of course, depending upon pin count and package configuration, the apertures 130 at each end of a row may only contain one contact pin and one lead.

It will be noted that no tools are required to insert the electronic device package into the mounting housing of the invention. The electronic device package is simply inserted within the channel defined by the pins and the cap and the cap compressed toward the base. As the pins are deflected longitudinally, the electronic device package drops into position on the cap with the leads inserted within the openings 130 and juxtaposed amongst the pins. When the cap is released, the cap automatically returns to a position spaced from the base with the pins being urged into effective electrical contact with side edges of the leads of the electronic device package.

Removal of the electronic device package from the mounting housing merely involves a reversal of the above steps, i.e., the cap is pressed downwardly to the loading position to deflect the pins away from the leads. The electronic device package 10 may then be withdrawn from the mounting housing without resistance.

Means are also provided to align the electronic device package with the mounting housing and guide the electronic device package to the desired position on the cap with the leads extending into the openings 130 and straddling the spreader members. In the illustrated embodiment, the guide and alignment means includes a pair of laterally spaced rim members 160 integrally formed in the cap and projecting above the first major surface 110 along each longitudinal edge and at least partially along each end edge. Further, the guide and alignment means may include longitudinally spaced pairs of integral upright frustoconical posts 162 or other similar guide means at either end of the cap. The posts 162 are constructed so as to receive the end edges of the housing 14 of the electronic device package in close confinement when inserted into the mounting housing and with the leads of the electronic device package properly positioned and aligned as hereinabove described. Further, the tapered shape of the posts 162 assists in guiding the electronic device package housing into the desired aligned position as it is lowered onto the first major surface 110 of the cap 22.

It should be noted that the structure of the embodiment described is extremely simple and may be readily fabricated from available materials. For instance, the base and the cap may be made from electrically insulating material such as molded or machined plastics or the like. The contact pins 80 are symmetrical about their longitudinal axes (except for the shanks 88), thus may be all identical and simply alternatively reversed during assembly to provide parallel rows of pins. Since the top of the mounting housing is open, a heat sink may be attached to the device package for dissipation of heat during use while inserted in the mounting housing.

It should be noted that the housing of this invention is extremely compact and has no closure lid or the like. Thus the housing may be inexpensively manufactured and occupies minimum space on a mounting substrate. Furthermore, the housing may be designed to accommodate electronic device packages of various configurations (i.e., having various numbers, sizes and spacing of leads as well as different sizes and shapes of housings) without modification of the basic design of the mounting housing. Because of the simplicity of design and the ease with which electronic device packages may be inserted into or withdrawn from the mounting housing of the invention, it has particular applicability and suitability for use in connection with burn-in boards wherein large numbers of electronic device packages are mounted on burn-in boards and tested under adverse conditions. The housing is likewise applicable for use as a mounting housing for end use circuit applications.

It will be noted that since the contact pins of the mounting housing of the invention contact only the side edges of the leads, the principles of the invention may be utilized to design mounting housings suitable for use with standard DIPs, SOICs, quad packages and other packages wherein the leads are fragile, curved or otherwise difficult to contact without damaging the leads or lead configuration. Furthermore, while the invention has been described with particular reference to packages having two parallel rows of leads (such as DIPs and SOICs), it will be readily recognized that mounting housings can be designed to accommodate packages (such as quad packages) having leads projecting from four edges by simply modifying the mounting housing to include contact pins, etc., arranged rectangularly in two sets of parallel rows. Accordingly, it is to be understood that although the invention has been described with particular reference to specific embodiments therefore, the forms of the invention shown and described in detail are to be taken as preferred embodiments of same and that various changes and modifications may be resorted to without departing from the spirit and scope of the invention as defined by the appended claims.

What is claimed:

1. A mounting housing for an electronic device package having a plurality of leads extending from said package substantially parallel with each other comprising:
   (a) a plurality of elongated contact pins arranged substantially parallel in a row extending along a first axis, each of said contact pins having a first end, a second end and a camming surface offset from the central axis thereof;
   (b) a base support member with first and second oppositely disposed major faces supporting said contact pins with said second end of each pin extending from said second major face and said first end of each said contact pin and said camming surface extending from said first major face;
   (c) receptacle means having first and second oppositely disposed major faces positioned substantially parallel with said base support member and reciprocally mounted for movement between a first position spaced from said base support member and a second position substantially adjacent said base support member;
   (d) a row of apertures extending through said receptacle means, each of said apertures receiving said first end of at least one of said contact pins; and
   (e) spreader means integral with said receptacle means and aligned to contact a camming surface on at least one of said pins when said receptacle means is moved from said first position to said second position and thereby deflect said first end of said at least one of said contact pins in a direction substantially parallel with said first axis to form an opening for receiving a lead extending from an electronic device package between said first end of said at least one pin and a side wall of the aperture receiving said first end.

2. A mounting housing as defined in claim 1 wherein said receptacle means includes guide means on said first major face thereof adapted to position said lead in said opening when said receptacle means is moved from said first position to said second position.

3. A mounting housing as defined in claim 1 wherein each of said contact pins comprises an elongated conductive body with a substantially centrally located base portion and said base support member includes a plurality of recesses adapted to receive and mate with said base portions of said pins and to support said pins with their respective central axes substantially parallel with each other and substantially normal to said second major face of said base support member.

4. A mounting housing as defined in claim 1 wherein said spreader means comprises a plurality of deflecting means, each adapted to substantially simultaneously contact a camming surface on two adjacent pins and deflect the said first ends of each said two adjacent pins in opposite directions.

5. A mounting housing as defined in claim 1 including spring means interposed between said base support member and said receptacle means to resiliently urge said receptacle means away from said base support member.

* * * * *